US012176857B2

United States Patent
Komatsuzaki et al.

(10) Patent No.: US 12,176,857 B2
(45) Date of Patent: Dec. 24, 2024

(54) DOHERTY AMPLIFIER AND COMMUNICATION DEVICE

(71) Applicant: Mitsubishi Electric Corporation, Tokyo (JP)

(72) Inventors: Yuji Komatsuzaki, Tokyo (JP); Satoru Honda, Tokyo (JP); Shuichi Sakata, Tokyo (JP); Shintaro Shinjo, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 587 days.

(21) Appl. No.: 17/490,109

(22) Filed: Sep. 30, 2021

(65) Prior Publication Data

US 2022/0021346 A1  Jan. 20, 2022

Related U.S. Application Data

(63) Continuation of application No. PCT/JP2019/017278, filed on Apr. 23, 2019.

(51) Int. Cl.
*H03F 3/68* (2006.01)
*H03F 1/02* (2006.01)
(Continued)

(52) U.S. Cl.
CPC ............ *H03F 1/0288* (2013.01); *H03F 1/56* (2013.01); *H03F 3/211* (2013.01);
(Continued)

(58) Field of Classification Search
CPC .......... H03F 1/0288; H03F 1/56; H03F 3/211; H03F 2200/222; H03F 2200/387;
(Continued)

(56) References Cited

U.S. PATENT DOCUMENTS

| 7,649,412 | B2 | 1/2010 | Horiguchi et al. |
| 9,438,187 | B2 * | 9/2016 | Yamaoka .............. H03F 1/0288 |
| 9,496,836 | B2 * | 11/2016 | Qureshi ................... H03F 3/68 |

(Continued)

FOREIGN PATENT DOCUMENTS

| EP | 1 912 328 B1 | 9/2011 |
| EP | 2 634 916 A1 | 9/2013 |

(Continued)

OTHER PUBLICATIONS

International Search Report (PCT/ISA/210) issued in PCT/JP2019/017278, mailed on Jul. 9, 2019.
German Office Action for German Application No. 112019007058.4, dated Feb. 19, 2024, with English translation.

*Primary Examiner* — Khanh V Nguyen
(74) *Attorney, Agent, or Firm* — Birch, Stewart, Kolasch & Birch, LLP

(57) ABSTRACT

This Doherty amplifier includes: a carrier amplifier for amplifying a first signal and outputting the amplified first signal; a peaking amplifier for amplifying a second signal and outputting the amplified second signal, the peaking amplifier having a non-linear output capacitance; a first output circuit for transmitting the first signal output from the carrier amplifier; a second output circuit for functioning as a virtual short stub when the peaking amplifier does not perform an amplification operation, and transmitting the second signal output from the peaking amplifier; and a combining circuit for combining the first signal transmitted by the first output circuit and the second signal transmitted by the second output circuit and outputting a combined signal of the first signal and the second signal, wherein, when the peaking amplifier performs the amplification operation, the second output circuit transforms an impedance seen by looking into the combining circuit from the peaking amplifier into an impedance in an inductive region.

6 Claims, 13 Drawing Sheets

(51) Int. Cl.
*H03F 1/56* (2006.01)
*H03F 3/21* (2006.01)
*H04B 1/04* (2006.01)

(52) U.S. Cl.
CPC .............. *H03F 2200/222* (2013.01); *H03F 2200/387* (2013.01); *H04B 1/04* (2013.01); *H04B 2001/0408* (2013.01)

(58) Field of Classification Search
CPC .............. H03F 2200/451; H03F 3/195; H03F 3/245; H03F 3/68; H03F 3/602; H04B 1/04; H04B 2001/0408
USPC ............................................. 330/124 R, 295
See application file for complete search history.

(56) References Cited

U.S. PATENT DOCUMENTS

| | | | |
|---|---|---|---|
| 9,748,902 B2* | 8/2017 | Ahmed | H03F 1/565 |
| 10,320,335 B1* | 6/2019 | Jang | H01L 23/66 |
| 10,411,653 B2* | 9/2019 | Takenaka | H03F 1/0288 |
| 10,608,594 B2* | 3/2020 | Komatsuzaki | H03F 1/0288 |
| 2009/0206926 A1 | 8/2009 | Horiguchi et al. | |
| 2015/0263678 A1 | 9/2015 | Kunihiro | |
| 2019/0149097 A1 | 5/2019 | Komatsuzaki et al. | |
| 2020/0091871 A1 | 3/2020 | Nakatani et al. | |

FOREIGN PATENT DOCUMENTS

| | | |
|---|---|---|
| WO | WO 2007/015462 A1 | 2/2007 |
| WO | WO 2017/199366 A1 | 11/2017 |
| WO | WO 2018/138763 A1 | 8/2018 |

\* cited by examiner

DOHERTY AMPLIFIER AND COMMUNICATION DEVICE

CROSS REFERENCE TO RELATED APPLICATIONS

This application is a Continuation of PCT International Application No. PCT/JP2019/017278, filed on Apr. 23, 2019, which is hereby expressly incorporated by reference into the present application.

TECHNICAL FIELD

The present invention relates to a Doherty amplifier and a communication device.

BACKGROUND ART

In a typical Doherty amplifier in which the saturated output power of a carrier amplifier and the saturated output power of a peaking amplifier are the same, an efficiency peak point when power lower than the saturated output power is output appears at a point where an amount of backoff from the saturated output power is 6 dB in the operation principle.

Patent Literature 1 below discloses a Doherty amplifier designed in such a manner that an efficiency peak point appears when an amount of backoff from saturated output power is larger than 6 dB, thereby enhancing efficiency when a signal level of an input signal is low.

In the Doherty amplifier disclosed in Patent Literature 1, a first phase line is connected to an output side of a carrier amplifier.

In addition, in the Doherty amplifier disclosed in Patent Literature 1, a second phase line is connected to an input side of a peaking amplifier, and a third phase line is connected to an output side of the peaking amplifier.

In the Doherty amplifier disclosed in Patent Literature 1, when the signal level of an input signal is low, the electrical lengths of the first and third phase lines are set in such a manner that an output impedance seen from an impedance reference point on the output side of the carrier amplifier is 2R+α. In addition, the electrical length of the second phase line is set to a difference between the electrical length of the first phase line and the electrical length of the third phase line. R is a load resistance, and α is a positive value.

CITATION LIST

Patent Literature

Patent Literature 1: WO 20071015462

SUMMARY OF INVENTION

Technical Problem

When the peaking amplifier disclosed in Patent Literature 1 outputs power lower than the saturated output power, the impedance seen by looking into an output combining node from the peaking amplifier is transformed into an impedance in a capacitive region. In addition, in the impedance transformed into the impedance in the capacitive region, a capacitive component further increases due to an output capacitance of the peaking amplifier, so that the distance from the real axis increases.

Therefore, when the peaking amplifier disclosed in Patent Literature 1 outputs power lower than the saturated output power, there is a problem that the efficiency of the Doherty amplifier may deteriorate.

The present invention has been made to solve the above problems, and an object of the present invention is to obtain a Doherty amplifier and a communication device capable of preventing deterioration in efficiency when a peaking amplifier outputs power lower than saturated output power.

Solution to Problem

A Doherty amplifier according to the present invention includes: a carrier amplifier for amplifying a first signal and outputting the amplified first signal; a peaking amplifier for amplifying a second signal and outputting the amplified second signal, the peaking amplifier having a non-linear output capacitance; a first output circuit for transmitting the first signal output from the carrier amplifier, a second output circuit for functioning as a virtual short stub when the peaking amplifier does not perform an amplification operation, and transmitting the second signal output from the peaking amplifier; and a combining circuit for combining the first signal transmitted by the first output circuit and the second signal transmitted by the second output circuit and outputting a combined signal of the first signal and the second signal, wherein, when the peaking amplifier performs the amplification operation, the second output circuit transforms an impedance seen by looking into the combining circuit from the peaking amplifier into an impedance in an inductive region, and the peaking amplifier reduces an inductive component of the impedance seen by looking into the combining circuit from the peaking amplifier by the non-linear output capacitance of the peaking amplifier.

Advantageous Effects of Invention

According to the present invention, the Doherty amplifier is configured in such a manner that, when the peaking amplifier performs an amplification operation, the second output circuit transforms the impedance seen by looking into the combining circuit from the peaking amplifier into an impedance in an inductive region.

Therefore, the Doherty amplifier according to the present invention can prevent deterioration in efficiency when the peaking amplifier outputs power lower than the saturated output power.

DESCRIPTION OF EMBODIMENTS

In order to describe the present invention in more detail, a mode for carrying out the present invention will now be described with reference to the accompanying drawings.

First Embodiment

Figure 1:
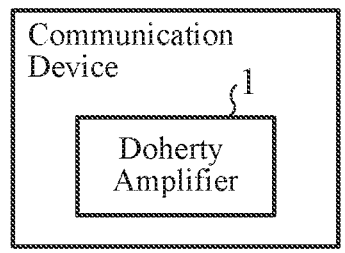
FIG. 1 is a configuration diagram illustrating a communication device including a Doherty amplifier 1 according to a first embodiment.

FIG. 1 is a configuration diagram illustrating a communication device including a Doherty amplifier 1 according to a first embodiment.

In FIG. 1, the Doherty amplifier 1 divides a communication signal into a first signal and a second signal, and amplifies each of the first signal and the second signal.

Figure 2:
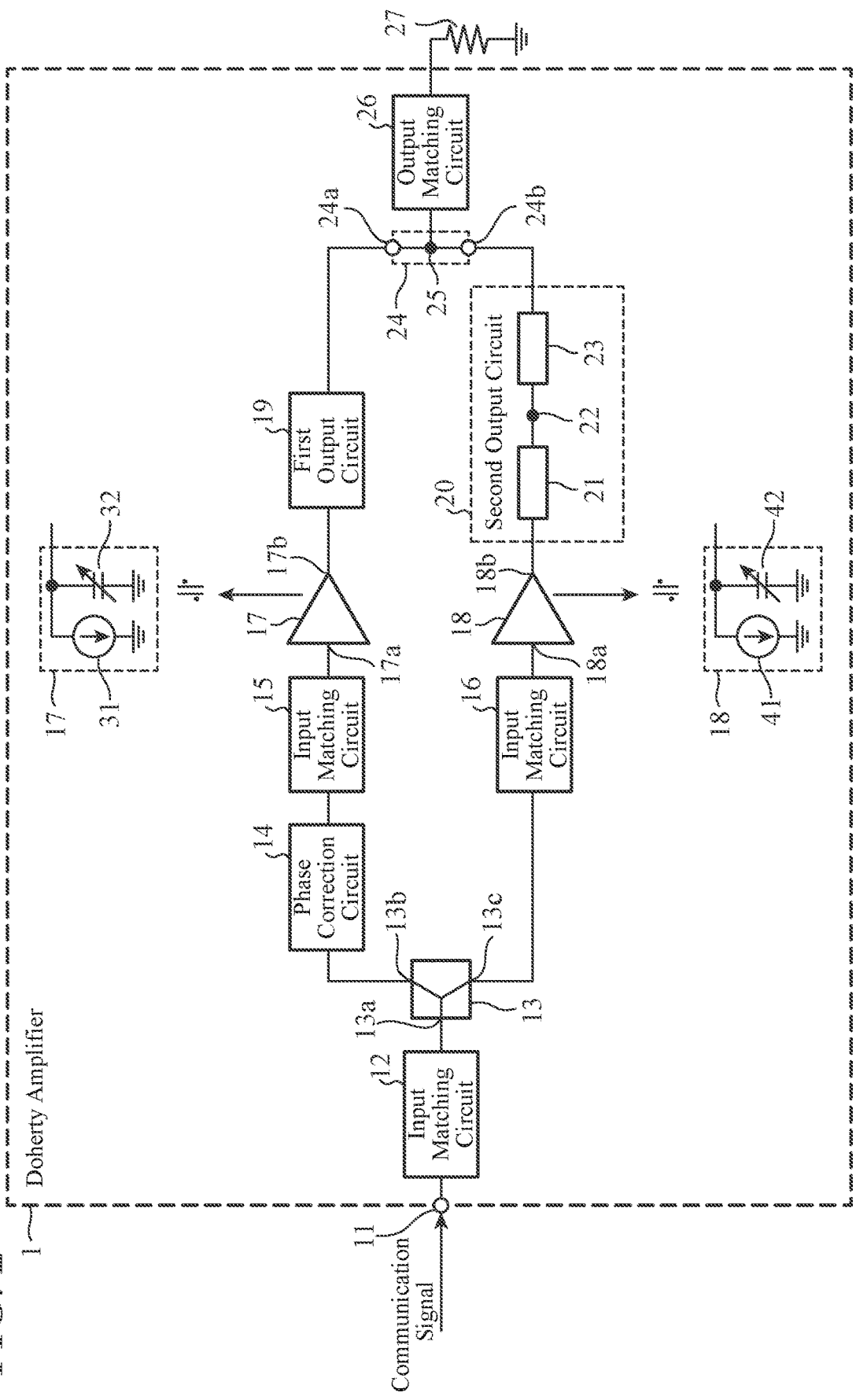
FIG. 2 is a configuration diagram illustrating the Doherty amplifier 1 according to the first embodiment.

FIG. 2 is a configuration diagram illustrating the Doherty amplifier 1 according to the first embodiment.

In FIG. 2, the communication signal is input to an input terminal 11.

An input matching circuit 12 is implemented by, for example, a circuit using a lumped parameter element, a circuit using a distributed constant line, a circuit in which a lumped constant and a distributed constant are combined, an L-C type matching circuit using a coil and a capacitor, or a quarter-wave line.

One end of the input matching circuit 12 is connected to the input terminal 11, and the other end of the input matching circuit 12 is connected to an input terminal 13a of a divider 13.

The input matching circuit 12 converts an impedance of the input terminal 11 into an input impedance of the divider 13, and outputs the communication signal input through the input terminal 11 to the divider 13.

The divider 13 is implemented by, for example, a Wilkinson divider or a hybrid circuit.

The input terminal 13a of the divider 13 is connected to the other end of the input matching circuit 12.

An output terminal 13b of the divider 13 is connected to one end of a phase correction circuit 14, and an output terminal 3c of the divider 13 is connected to one end of an input matching circuit 16.

The divider 13 divides the communication signal output from the input matching circuit 12 into the first signal and the second signal, outputs the first signal from the output terminal 13b to the phase correction circuit 14, and outputs the second signal from the output terminal 13c to the input matching circuit 16.

The phase correction circuit 14 is implemented by, for example, a circuit using a lumped parameter element, a circuit using a distributed constant line, a circuit in which a lumped constant and a distributed constant are combined, an L-C type matching circuit, or a quarter-wave line.

The phase correction circuit 14 is a circuit that makes an electrical length of a path from the output terminal 13b of the divider 13 to a combining node 25 of a combining circuit 24 on a carrier amplifier 17 side equal to an electrical length of a path from the output terminal 13c of the divider 13 to the combining node 25 on a peaking amplifier 18 side.

However, the electrical length of the path on the carrier amplifier 17 side and the electrical length of the path on the peaking amplifier 18 side are not limited to be exactly the same, and the electrical length of the path on the carrier amplifier 17 side and the electrical length of the path on the peaking amplifier 18 side may be different from each other as long as there is no practical problem.

The input matching circuit 15 is implemented by, for example, a circuit using a lumped parameter element, a circuit using a distributed constant line, a circuit in which a lumped constant and a distributed constant are combined, an L-C type matching circuit, or a quarter-wave line.

One end of the input matching circuit 15 is connected to the other end of the phase correction circuit 14, and the other end of the input matching circuit 15 is connected to an input terminal 17a of the carrier amplifier 17.

The input matching circuit 15 converts an impedance of the phase correction circuit 14 into an input impedance of the carrier amplifier 17, and outputs the first signal output from the phase correction circuit 14 to the input terminal 17a of the carrier amplifier 17.

The input matching circuit 16 is implemented by, for example, a circuit using a lumped parameter element, a circuit using a distributed constant line, a circuit in which a lumped constant and a distributed constant are combined, an L-C type matching circuit, or a quarter-wave line.

One end of the input matching circuit 16 is connected to the output terminal 13c of the divider 13, and the other end of the input matching circuit 16 is connected to an input terminal 18a of the peaking amplifier 18.

The input matching circuit 16 converts an impedance of the output terminal 13c of the divider 13 into an input impedance of the peaking amplifier 18, and outputs the second signal output from the output terminal 13c of the divider 13 to the input terminal 18a of the peaking amplifier 18.

The carrier amplifier 17 is implemented by, for example, a field effect transistor (FET), a heterojunction bipolar transistor (HBT), or a high electron mobility transistor (HEMT).

In the Doherty amplifier 1 illustrated in FIG. 2, the carrier amplifier 17 is a transistor in which a source is grounded. A gate terminal which is the input terminal 17a of the carrier amplifier 17 is connected to the other end of the input matching circuit 15, and a drain terminal which is the output terminal 17b of the carrier amplifier 17 is connected to one end of a first output circuit 19. The first output circuit 19 will be described later.

The input terminal 17a of the carrier amplifier 17 is biased between class A and class B.

The carrier amplifier 17 has a non-linear output capacitance, amplifies the first signal output from the input matching circuit 15, and outputs the amplified first signal to the first output circuit 19.

When the carrier amplifier 17 is represented by an equivalent circuit, the carrier amplifier 17 can be represented by a current source 31 and a capacitor 32 having an output capacitance.

The peaking amplifier 18 is implemented by, for example, an FET, an HBT, or an HEMT.

In the Doherty amplifier 1 illustrated in FIG. 2, the peaking amplifier 18 is a transistor in which a source is grounded. Agate terminal which is the input terminal 18a of the peaking amplifier 18 is connected to the other end of the input matching circuit 16, and a drain terminal which is the output terminal 18b of the peaking amplifier 18 is connected to one end of a second output circuit 20. The second output circuit 20 will be described later.

The input terminal 18a of the peaking amplifier 18 is biased for class C.

The peaking amplifier 18 amplifies the second signal output from the input matching circuit 16 and outputs the amplified second signal to the second output circuit 20.

When the peaking amplifier 18 is represented by an equivalent circuit, the peaking amplifier 18 can be represented by a current source 41 and a capacitor 42 having an output capacitance.

The output capacitance of the capacitor 42 increases nonlinearly with an increase in the output power of the peaking amplifier 18.

The peaking amplifier 18 acts to reduce the inductive component of the impedance seen by looking into the combining circuit 24 from the peaking amplifier 18 by its non-linear output capacitance.

The first output circuit 19 is implemented by, for example, a transmission line having an electrical length of less than 90 degrees.

One end of the first output circuit 19 is connected to the output terminal 17b of the carrier amplifier 17, and the other end of the first output circuit 19 is connected to an input terminal 24a of the combining circuit 24.

The first output circuit 19 transmits the first signal output from the carrier amplifier 17 and outputs the first signal to the combining circuit 24.

The first output circuit 19 has an electrical length of less than 90 degrees that compensates for reactance of the second output circuit 20 as seen from the output side of the carrier amplifier 17, when the peaking amplifier 18 does not perform an amplification operation.

The characteristic impedance of the first output circuit 19 matches an optimum load impedance Ropt when the output power of the carrier amplifier 17 reaches saturated output power. However, the characteristic impedance of the first output circuit 19 is not limited to exactly match the optimum load impedance Ropt, and may deviate from the optimum load impedance Ropt as long as there is no practical problem.

The second output circuit 20 has an electrical length larger than 90 degrees and smaller than 180 degrees, and includes a transmission line 21 and a transmission line 23 as two transmission lines. A connection node 22 is a point at which the transmission line 21 and the transmission line 23 are connected.

In the Doherty amplifier illustrated in FIG. 2, the second output circuit 20 includes the transmission line 21 and the transmission line 23. However, this is merely an example, and the second output circuit 20 may include one transmission line formed by integrating the transmission line 21 and the transmission line 23.

One end of the second output circuit 20 is connected to the output terminal 18b of the peaking amplifier 18, and the other end of the second output circuit 20 is connected to an input terminal 24b of the combining circuit 24.

The second output circuit 20 transmits the second signal output from the peaking amplifier 18 and outputs the second signal to the combining circuit 24.

The characteristic impedance of the second output circuit 20 matches the optimum load impedance Ropt when the output power of the peaking amplifier 18 reaches saturated output power. However, the characteristic impedance of the second output circuit 20 is not limited to exactly match the optimum load impedance Ropt, and may deviate from the optimum load impedance Ropt as long as there is no practical problem.

Here, the second output circuit 20 has an electrical length larger than 90 degrees and smaller than 180 degrees. However, this is merely an example, and the second output circuit 20 may have an electrical length greater than −90 degrees and less than 0 degrees in the left-handed coordinate system. In a case where the second output circuit 20 has an electrical length larger than −90 degrees and smaller than 0 degrees in the left-handed coordinate system, the second output circuit 20 includes a left-handed filter circuit.

When the peaking amplifier 18 performs an amplification operation, the second output circuit 20 transforms the impedance seen by looking into the combining circuit 24 from the peaking amplifier 18 into an impedance in an inductive region.

During backoff in which the peaking amplifier 18 stops, the second output circuit 20 forms a short point at the connection node 22 between the peaking amplifier 18 and the combining circuit 24.

When the peaking amplifier 18 outputs power lower than the saturated output power, the second output circuit 20 transforms the impedance seen by looking into the combining circuit 24 from the peaking amplifier 18 into an impedance in the inductive region according to an amount of backoff of the peaking amplifier 18.

At this time, the peaking amplifier 18 reduces the inductive component of the impedance seen by looking into the combining circuit 24 from the peaking amplifier 18 by the output capacitance of the capacitor 42.

The transmission line 21 has an electrical length of 90 degrees.

One end of the transmission line 21 is connected to the output terminal 18b of the peaking amplifier 18, and the other end of the transmission line 21 is connected to the connection node 22.

The transmission line 23 has an electrical length smaller than 90 degrees.

One end of the transmission line 23 is connected to the connection node 22, and the other end of the transmission line 23 is connected to the input terminal 24b of the combining circuit 24.

The combining circuit 24 has the combining node 25 where the first signal output from the first output circuit 19 and the second signal output from the second output circuit 20 are combined.

The input terminal 24a of the combining circuit 24 is connected to the other end of the first output circuit 19.

The input terminal 24b of the combining circuit 24 is connected to the other end of the transmission line 23.

The combining circuit 24 combines the first signal output from the first output circuit 19 and the second signal output from the second output circuit 20.

The combining circuit 24 outputs a combined signal of the first signal and the second signal to an output matching circuit 26.

The combining node 25 is a point where the first signal output from the first output circuit 19 and the second signal output from the second output circuit 20 are combined. One end of the output matching circuit 26 is connected to the combining node 25.

The output matching circuit 26 is implemented by, for example, a circuit using a lumped parameter element, a circuit using a distributed constant line, a circuit in which a lumped constant and a distributed constant are combined, an L-C type matching circuit, or a quarter-wave line.

One end of the output matching circuit 26 is connected to the combining node 25, and the other end of the output matching circuit 26 is connected to a load 27 outside the Doherty amplifier 1.

The output matching circuit 26 converts an impedance at the combining node 25 into an impedance of the load 27.

The load 27 is a load outside the Doherty amplifier 1 connected to the other end of the output matching circuit 26.

Next, the operation of the Doherty amplifier 1 shown in FIG. 2 will be described.

Upon receiving the communication signal input from the input terminal 11, the input matching circuit 12 converts the impedance of the input terminal 11 into the input impedance of the divider 13, and outputs the communication signal to the divider 13.

When receiving the communication signal from the input matching circuit 12, the divider 13 divides the communication signal into a first signal and a second signal.

The divider 13 outputs the first signal from the output terminal 13b to the phase correction circuit 14 and outputs the second signal from the output terminal 13c to the input matching circuit 16.

When receiving the first signal from the output terminal 13b of the divider 13, the phase correction circuit 14 outputs the first signal to the input matching circuit 15.

At this time, the phase correction circuit 14 acts to make the electrical length of the path from the output terminal 13b of the divider 13 to the combining node 25 on the carrier amplifier 17 side equal to the electrical length of the path from the output terminal 13c of the divider 13 to the combining node 25 on the peaking amplifier 18 side.

When receiving the first signal from the phase correction circuit 14, the input matching circuit 15 converts the impedance of the phase correction circuit 14 into the input impedance of the carrier amplifier 17, and outputs the first signal to the input terminal 17a of the carrier amplifier 17.

When receiving the first signal from the input matching circuit 15, the carrier amplifier 17 amplifies the first signal and outputs the amplified first signal to the first output circuit 19.

When receiving the amplified first signal from the carrier amplifier 17, the first output circuit 19 transmits and outputs the first signal to the combining circuit 24.

When receiving the second signal from the output terminal 13c of the divider 13, the input matching circuit 16 converts the impedance of the output terminal 13c of the divider 13 into the input impedance of the peaking amplifier 18, and outputs the second signal to the input terminal 18a of the peaking amplifier 18.

When receiving the second signal from the input matching circuit 16, the peaking amplifier 18 amplifies the second signal and outputs the amplified second signal to the second output circuit 20.

When receiving the amplified second signal from the peaking amplifier 18, the second output circuit 20 transmits and outputs the second signal to the combining circuit 24.

The combining circuit 24 combines the first signal output from the first output circuit 19 and the second signal output from the second output circuit 20.

The combining circuit 24 outputs a combined signal of the first signal and the second signal to the output matching circuit 26.

When receiving the combined signal from the combining circuit 24, the output matching circuit 26 converts the impedance at the combining node 25 into the impedance of the external load 27 and outputs the combined signal to the load 27.

Next, the operation of the Doherty amplifier 1 during backoff in which the peaking amplifier 18 stops will be described.

Figure 3:
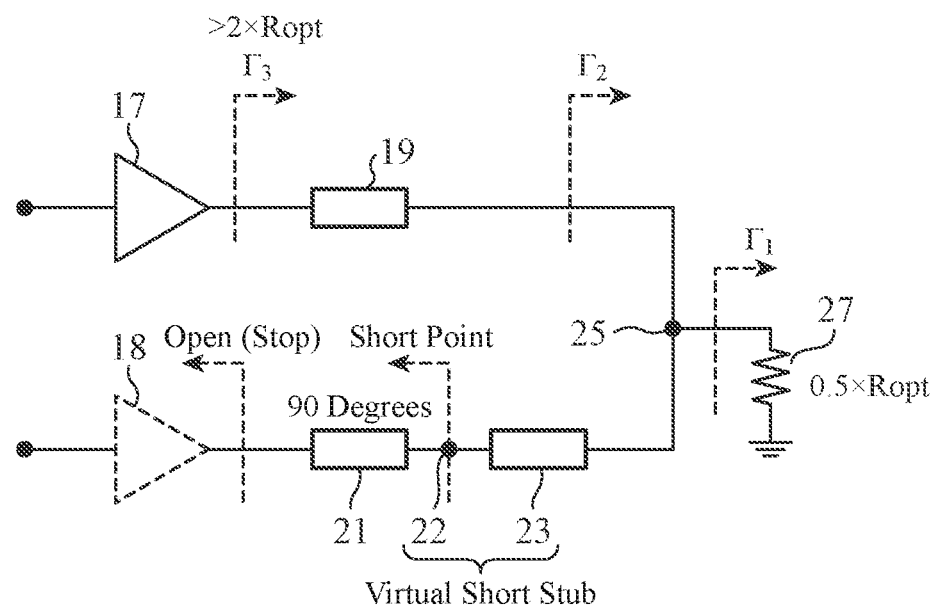
FIG. 3 is an explanatory diagram illustrating an operation of the Doherty amplifier 1 during backoff.

FIG. 3 is an explanatory diagram illustrating an operation of the Doherty amplifier 1 during backoff. In FIG. 3, the output matching circuit 26 is not illustrated.

Figure 4:
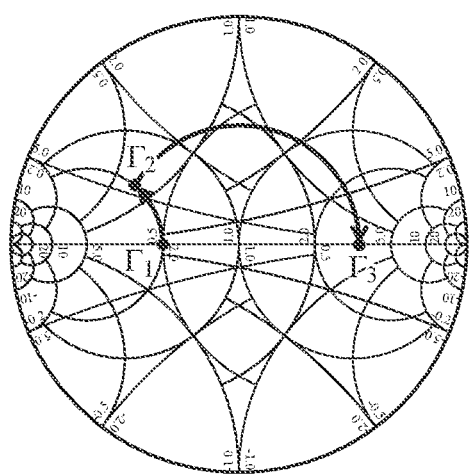
FIG. 4 is an explanatory diagram illustrating load transformation in the operation of the Doherty amplifier 1 during backoff.

FIG. 4 is an explanatory diagram illustrating load transformation in the operation of the Doherty amplifier 1 during backoff.

During backoff, the peaking amplifier 18 stops, and thus, the output impedance of the peaking amplifier 18 is in an open state as illustrated in FIG. 3.

The output impedance of the peaking amplifier 18 is transformed by the transmission line 21 having an electrical length of 90 degrees, and a short point is formed at the connection node 22.

Since the short point is formed at the connection node 22, the transmission line 23 functions as a virtual short stub when the peaking amplifier 18 is seen from the combining node 25.

Since the transmission line 23 functions as a virtual short stub, the output load Ropt, which is an impedance $\Gamma_1$ seen by looking into the load 27 from the combining node 25, is transformed into an impedance $\Gamma_2$ as illustrated in FIG. 4.

The impedance $\Gamma_2$ is transformed into an impedance $\Gamma_3$ on the real axis by the first output circuit 19 as illustrated in FIG. 4.

The impedance $\Gamma_3$ is the output load impedance of the carrier amplifier 17, and is larger than the output load impedance 2×Ropt of the carrier amplifier in a typical Doherty amplifier. The typical Doherty amplifier herein means a Doherty amplifier in which the saturated output power of the carrier amplifier and the saturated output power of the peaking amplifier are the same, and an amount of backoff is 6 dB.

Therefore, the amount of backoff of the Doherty amplifier 1 illustrated in FIG. 2 can be made larger than the amount of backoff of a typical Doherty amplifier.

Next, the operation of the Doherty amplifier 1 when the peaking amplifier 18 outputs power lower than the saturated output power will be described.

Figure 5:
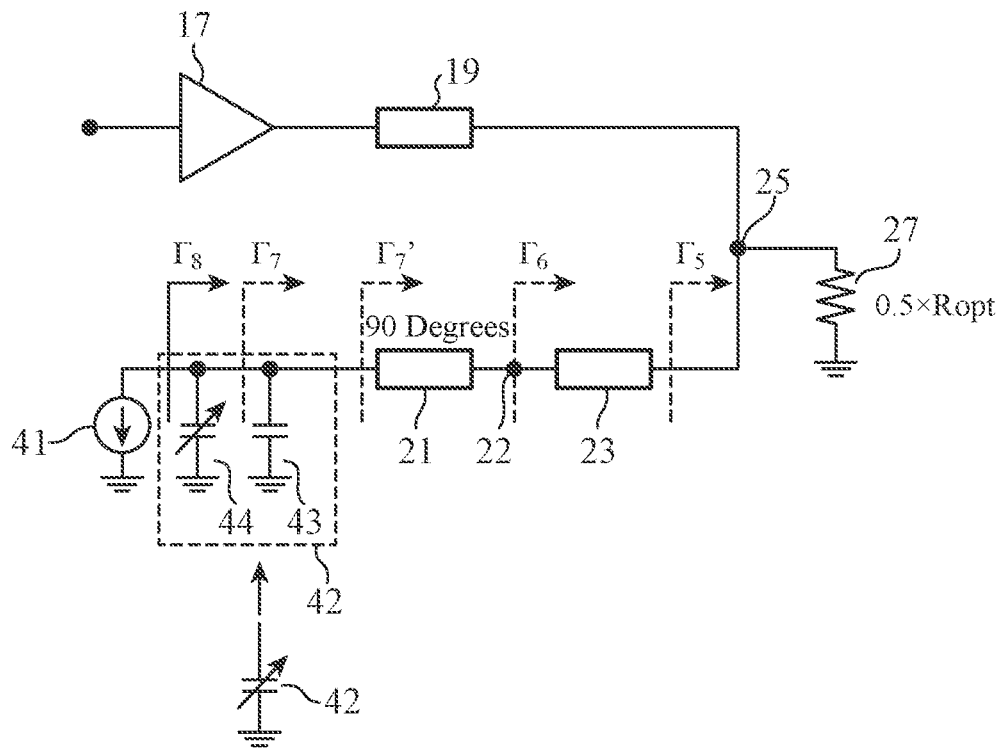
FIG. 5 is an explanatory diagram illustrating the operation of the Doherty amplifier 1 when a peaking amplifier 18 outputs power lower than saturated output power.

FIG. 5 is an explanatory diagram illustrating the operation of the Doherty amplifier 1 when the peaking amplifier 18 outputs power lower than the saturated output power. In FIG. 5, the output matching circuit 26 is not illustrated.

Figure 6:
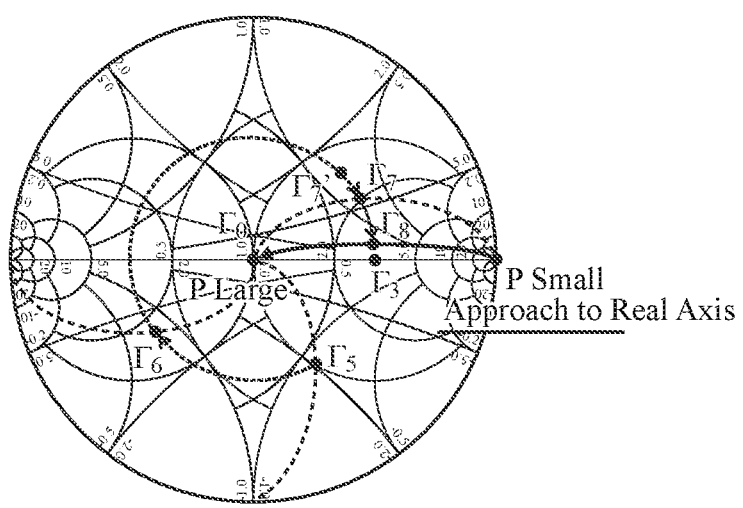
FIG. 6 is an explanatory diagram illustrating load transformation of the Doherty amplifier 1 when the peaking amplifier 18 outputs power lower than saturated output power.

FIG. 6 is an explanatory diagram illustrating load transformation of the Doherty amplifier 1 when the peaking amplifier 18 outputs power lower than the saturated output power.

First, the electrical length $EL_1$ of the first output circuit 19 is determined depending on a desired amount of backoff OBO as expressed in the following Equations (1) and (3).

The electrical length $EL_2$ of the second output circuit 20 is determined depending on the desired amount of backoff OBO as expressed in the following Equations (2) and (3).

$$EL_1 = \pi - \tan^{-1}\left(-\sqrt{\frac{\gamma(\gamma-1)}{\gamma-4}}\right) \quad (1)$$

$$EL_2 = \pi - \tan^{-1}\left(-\sqrt{\frac{(\gamma-4)(\gamma-1)}{\gamma}}\right) \quad (2)$$

$$OBO = 10\log\gamma [dB] \quad (3)$$

The output load impedance of the carrier amplifier 17 is load transformed in accordance with the output power of the peaking amplifier 18. Specifically, as illustrated in FIG. 6, the output load impedance of the carrier amplifier 17 is load transformed from the impedance $\Gamma_3$ on the real axis to the impedance $\Gamma_0$ on the real axis. The impedance $\Gamma_0$ is an optimum load impedance Ropt when the output power of the carrier amplifier 17 reaches the saturated output power.

The output load impedance of the peaking amplifier 18 is transformed as follows.

Here, for convenience of description, the output capacitance of the capacitor 42, which is the output capacitance of the peaking amplifier 18, is separated into a capacitor 43 having an output capacitance when the signal level of the second signal is small and a capacitor 44 having an increased amount of output capacitance increased by an increase in the signal level of the second signal, as illustrated in FIG. 5.

When the peaking amplifier 18 outputs power lower than the saturated output power, an impedance $\Gamma_5$ seen by looking into the combining node 25 from the transmission line 23 is an impedance in a capacitive region as illustrated in FIG. 6.

The impedance $\Gamma_5$ is impedance transformed by an amount corresponding to an electrical length less than 90 degrees of the transmission line 23, and the impedance seen by looking into the transmission line 23 from the connection node 22 is $\Gamma_6$. As illustrated in FIG. 6, the impedance $\Gamma_6$ is an impedance in a capacitive region.

The impedance $\Gamma_6$ is impedance transformed by an amount corresponding to an electrical length of 90 degrees of the transmission line 21, and the impedance seen by looking into the transmission line 21 from between the capacitor 43 and the capacitor 44 is $\Gamma_7$.

Since the second output circuit 20 is an inductive circuit that functions as a virtual short stub during backoff, the impedance $\Gamma_7$ is transformed into an impedance in the inductive region as illustrated in FIG. 6.

In the Doherty amplifier 1 illustrated in FIG. 2, the peaking amplifier 18 includes the capacitor 44 having an increased amount of output capacitance. Therefore, the impedance $\Gamma_7$ is impedance transformed so as to approach the real axis by an increase amount of output capacitance of the capacitor 44, and the impedance seen by looking into the combining node 25 from the current source 41 of the peaking amplifier 18 is $\Gamma_8$.

The impedance $\Gamma_8$ seen by looking into the combining node 25 from the current source 41 of the peaking amplifier 18 is any one of impedances on the real axis illustrated in FIG. 6 depending on the output power of the peaking amplifier 18. The solid line illustrated in FIG. 6 is present in a region close to the real axis.

Therefore, during a period from the backoff in which the output power of the peaking amplifier 18 is zero until the output power of the peaking amplifier 18 reaches the saturated output power, the output load impedance of the peaking amplifier 18 is load transformed from the open point to the impedance $\Gamma_0$ on the real axis along the solid line illustrated in FIG. 6. In FIG. 6, the open point is represented as "P small", and "P small" means that the output power is zero. $\Gamma_6$ is an impedance at a point represented as "P large", and "P large" means that the output power reaches the saturated output power.

In the Doherty amplifier disclosed in Patent Literature 1, when the peaking amplifier outputs power lower than the saturated output power, the impedance seen by looking into an output combining node from the peaking amplifier is transformed into an impedance in a capacitive region. The distance between the real axis and the impedance seen by looking into the output combining node from the peaking amplifier is substantially equal to the distance between the real axis and an impedance $\Gamma_7'$ seen by looking into the combining circuit 24 from the peaking amplifier 18 illustrated in FIG. 2.

In addition, in the Doherty amplifier disclosed in Patent Literature 1, the capacitive component of the impedance seen by looking into the output combining node from the peaking amplifier is further increased by the output capacitance of the peaking amplifier. Therefore, the impedance seen by looking into the output combining node from the peaking amplifier is transformed in such a manner that the distance between the real axis and the impedance seen by looking into the output combining node from the peaking amplifier increases by the output capacitance of the peaking amplifier.

In the Doherty amplifier 1 illustrated in FIG. 2, the inductive component of the impedance $\Gamma_7$ transformed into an impedance in the inductive region is reduced by an increased amount of the output capacitance of the capacitor 44. Therefore, the distance between the real axis and the impedance $\Gamma_8$ seen by looking into the combining node 25 from the current source 41 of the peaking amplifier 18 is smaller than the distance between the real axis and the impedance seen by looking into the output combining node from the peaking amplifier in the Doherty amplifier disclosed in Patent Literature 1.

Therefore, the Doherty amplifier 1 illustrated in FIG. 2 can achieve impedance transformation for allowing impedance to approach a region closer to the real axis as compared to the Doherty amplifier disclosed in Patent Literature 1.

Figure 7:
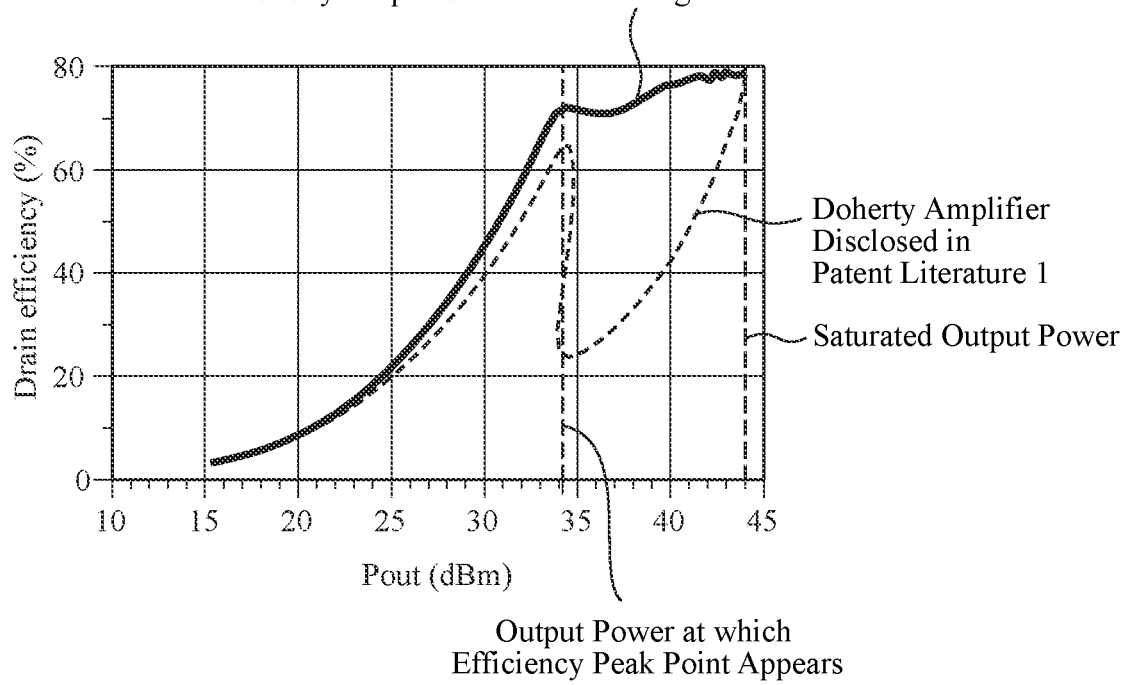
FIG. 7 is an explanatory diagram illustrating simulation results of the efficiency of the Doherty amplifier according to the first embodiment and the efficiency of the Doherty amplifier 1 disclosed in Patent Literature 1.

FIG. 7 is an explanatory diagram illustrating simulation results of the efficiency of the Doherty amplifier according to the first embodiment and the efficiency of the Doherty amplifier 1 disclosed in Patent Literature 1.

In the Doherty amplifier disclosed in Patent Literature 1, as illustrated in FIG. 7, the output power of the peaking amplifier is greatly degraded in efficiency from the power at which the efficiency peak point appears to the saturated output power. That is, the output power of the peaking amplifier is greatly degraded in efficiency in reaching the saturated output power from a zero output power.

In the Doherty amplifier 1 according to the first embodiment, the output power of the peaking amplifier 18 is not greatly degraded in efficiency in reaching the saturated output power from the zero power, which means the Doherty amplifier 1 according to the first embodiment has higher efficiency than the Doherty amplifier disclosed in Patent Literature 1.

In the first embodiment described above, the Doherty amplifier 1 is configured in such a manner that the second output circuit 20 transforms the impedance seen by looking into the combining circuit 24 from the peaking amplifier 18 into an impedance in the inductive region when the peaking amplifier 18 performs the amplification operation. Therefore, the Doherty amplifier 1 can prevent deterioration in efficiency when the peaking amplifier 18 outputs power lower than the saturated output power.

Second Embodiment

In the second embodiment, a Doherty amplifier 1 in which the saturated output power of the peaking amplifier 18 is larger than the saturated output power of the carrier amplifier 17 will be described.

The configuration of the Doherty amplifier 1 according to the second embodiment is similar to the configuration of the Doherty amplifier 1 according to the first embodiment, and FIG. 2 is used as a configuration diagram illustrating the Doherty amplifier 1 according to the second embodiment.

Next, the operation of the Doherty amplifier 1 during backoff in which the peaking amplifier 18 stops will be described.

Figure 8:
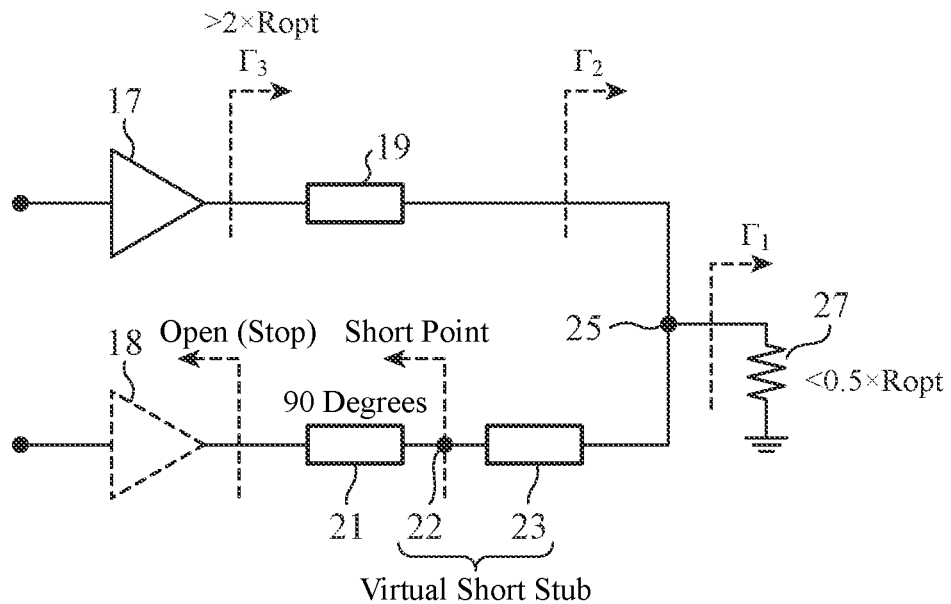
FIG. 8 is an explanatory diagram illustrating an operation of the Doherty amplifier 1 during backoff.

FIG. 8 is an explanatory diagram illustrating an operation of the Doherty amplifier 1 during backoff. In FIG. 8, the output matching circuit 26 is not illustrated.

Figure 9:
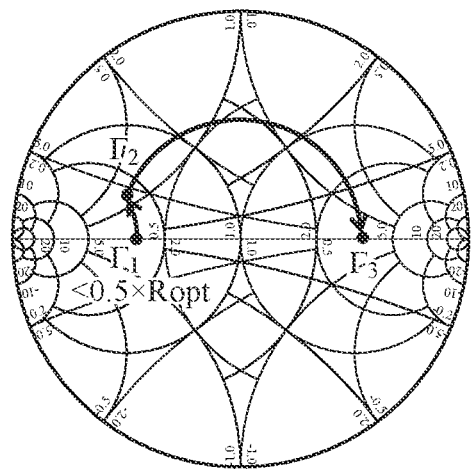
FIG. 9 is an explanatory diagram illustrating load transformation in the operation of the Doherty amplifier 1 during backoff.

FIG. 9 is an explanatory diagram illustrating load transformation in the operation of the Doherty amplifier 1 during backoff.

In the Doherty amplifier 1 according to the second embodiment, it is assumed that the optimum load impedance when the output power of the carrier amplifier 17 reaches the saturated output power is Ropt, and the optimum load impedance when the output power of the peaking amplifier 18 reaches the saturated output power is K×Ropt. K is a value smaller than 1 and larger than 0.

Since an impedance $\Gamma_1$ seen by looking into the load 27 from the combining node 25 is a combined impedance of the optimum load impedance Ropt and the optimum load impedance K×Ropt, it is smaller than 0.5×Ropt as illustrated in FIG. 9.

Therefore, the impedance $\Gamma_1$ in the Doherty amplifier 1 according to the second embodiment is smaller than the impedance $\Gamma_1$ in the Doherty amplifier 1 according to the first embodiment.

During backoff, the peaking amplifier 18 is stopped, and thus, the output impedance of the peaking amplifier 18 is in an open state as illustrated in FIG. 8.

The output impedance of the peaking amplifier 18 is transformed by the transmission line 21 having an electrical length of 90 degrees, and a short point is formed at the connection node 22.

Since the short point is formed at the connection node 22, the transmission line 23 functions as a virtual short stub when the peaking amplifier 18 is seen from the combining node 25.

Since the transmission line 23 functions as a virtual short stub, the output load L×0.5×Ropt, which is the impedance $\Gamma_1$ seen by looking into the load 27 from the combining node 25, is transformed into an impedance $\Gamma_2$. L is a value smaller than 1 and larger than 0.

As illustrated in FIG. 9, the impedance $\Gamma_2$ is transformed into an impedance $\Gamma_3$ on the real axis by the first output circuit 19.

The impedance $\Gamma_3$ is the output load impedance of the carrier amplifier 17, and is larger than the impedance 2×Ropt of a typical Doherty amplifier when the amount of backoff is 6 dB.

Therefore, the amount of backoff of the Doherty amplifier 1 according to the second embodiment can be made larger than the amount of backoff of a typical Doherty amplifier.

Next, the operation of the Doherty amplifier 1 when the peaking amplifier 18 outputs power lower than the saturated output power will be described.

Figure 10:
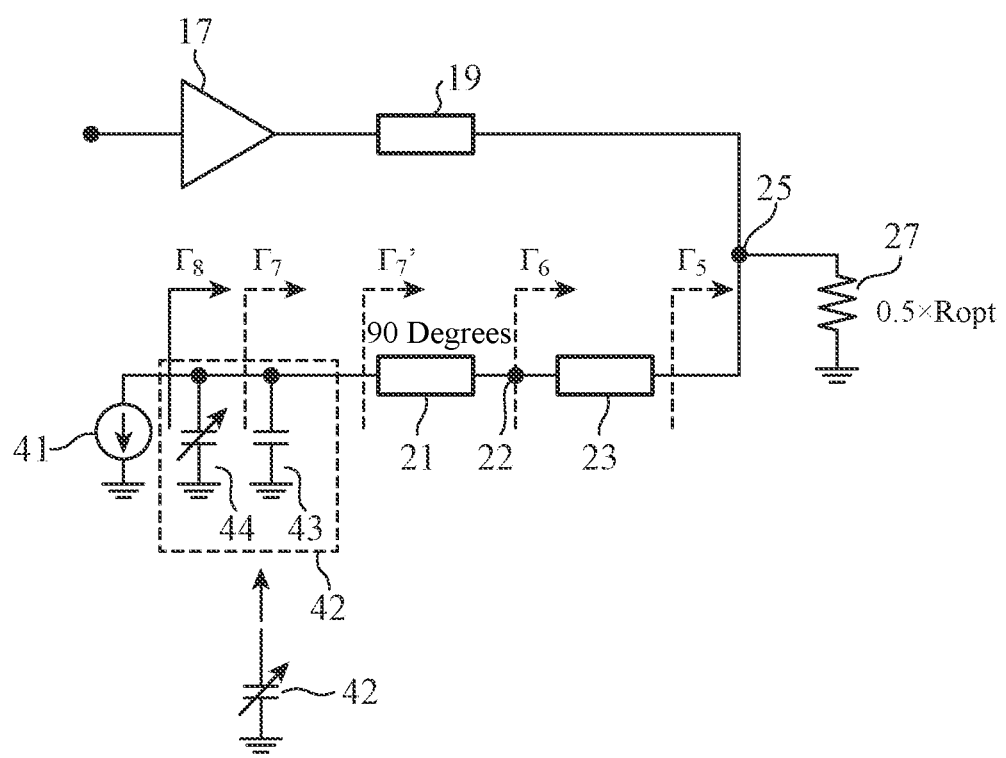
FIG. 10 is an explanatory diagram illustrating the operation of the Doherty amplifier 1 when the peaking amplifier 18 outputs power lower than saturated output power.

FIG. 10 is an explanatory diagram illustrating the operation of the Doherty amplifier 1 when the peaking amplifier 18 outputs power lower than the saturated output power. In FIG. 10, the output matching circuit 26 is not illustrated.

Figure 11:
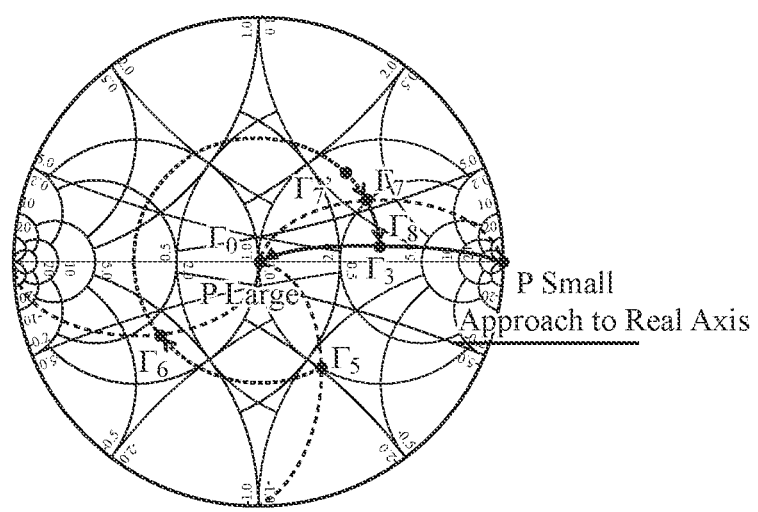
FIG. 11 is an explanatory diagram illustrating load transformation of the Doherty amplifier 1 when the peaking amplifier 18 outputs power lower than saturated output power.

FIG. 11 is an explanatory diagram illustrating load transformation of the Doherty amplifier 1 when the peaking amplifier 18 outputs power lower than the saturated output power.

The output load impedance of the carrier amplifier 17 is load transformed in accordance with the output power of the peaking amplifier 18. Specifically, the output load impedance of the carrier amplifier 17 is transformed from the impedance $\Gamma_3$ on the real axis to the impedance $\Gamma_0$ on the real axis as illustrated in FIG. 11. The impedance $\Gamma_0$ is an optimum load impedance Ropt when the output power of the carrier amplifier 17 reaches the saturated output power.

The output load impedance of the peaking amplifier 18 is transformed as follows.

When the peaking amplifier 18 outputs power lower than the saturated output power, the impedance $\Gamma_5$ seen by looking into the combining node 25 from the transmission line 23 is an impedance in a capacitive region as illustrated in FIG. 11.

The impedance $\Gamma_5$ is impedance transformed by an amount corresponding to an electrical length less than 90 degrees of the transmission line 23, and the impedance seen by looking into the transmission line 23 from the connection node 22 is $\Gamma_6$. As illustrated in FIG. 11, the impedance $\Gamma_6$ is an impedance in a capacitive region.

The impedance $\Gamma_6$ is transformed by an amount corresponding to the electrical length of 90 degrees of the transmission line 21, and the impedance seen by looking into the transmission line 21 from between the capacitor 43 and the capacitor 44 is $\Gamma_7$.

Since the second output circuit 20 is an inductive circuit that functions as a virtual short stub during backoff, the impedance $\Gamma_7$ is transformed into an impedance in the inductive region as illustrated in FIG. 11.

In the Doherty amplifier 1 according to the second embodiment, the peaking amplifier 18 includes a capacitor 44 having an increased amount of output capacitance. Therefore, the impedance $\Gamma_7$ is impedance transformed so as to approach the real axis by an increase amount of output capacitance of the capacitor 44, and the impedance seen by looking into the combining node 25 from the current source 41 of the peaking amplifier 18 is $\Gamma_8$.

The impedance $\Gamma_8$ seen by looking into the combining node 25 from the current source 41 of the peaking amplifier 18 is any one of impedances on the real axis illustrated in FIG. 11 depending on the output power of the peaking amplifier 18. The solid line illustrated in FIG. 11 is present in a region close to the real axis.

Therefore, during a period from the backoff in which the output power of the peaking amplifier 18 is zero until the output power of the peaking amplifier 18 reaches the saturated output power, the output load impedance of the peaking amplifier 18 is load transformed from the open point to the impedance $\Gamma_0$ on the real axis along the solid line illustrated in FIG. 11.

In the Doherty amplifier disclosed in Patent Literature 1, when the peaking amplifier outputs power lower than the saturated output power, the impedance seen by looking into the output combining node from the peaking amplifier is transformed into an impedance in a capacitive region. The distance between the real axis and the impedance seen by looking into the output combining node from the peaking amplifier is substantially equal to the distance between the real axis and an impedance $\Gamma_7'$ seen by looking into the combining circuit 24 from the peaking amplifier 18 illustrated in FIG. 2.

In addition, in the Doherty amplifier disclosed in Patent Literature 1, the capacitive component of the impedance seen by looking into the output combining node from the peaking amplifier is further increased by the output capacitance of the peaking amplifier. Therefore, the impedance seen by looking into the output combining node from the peaking amplifier is transformed in such a manner that the distance between the real axis and the impedance seen by looking into the output combining node from the peaking amplifier increases by the output capacitance of the peaking amplifier.

In the Doherty amplifier 1 according to the second embodiment, the inductive component of the impedance $\Gamma_7$ transformed into the impedance in the inductive region is reduced by an increased amount of the output capacitance of the capacitor 44. Therefore, the distance between the real axis and the impedance $\Gamma_8$ seen by looking into the combining node 25 from the current source 41 of the peaking amplifier 18 is smaller than the distance between the real axis and the impedance seen by looking into the output combining node from the peaking amplifier in the Doherty amplifier disclosed in Patent Literature 1.

Therefore, the Doherty amplifier 1 according to the second embodiment can achieve impedance transformation for allowing impedance to approach a region closer to the real axis as compared to the Doherty amplifier disclosed in Patent Literature 1.

Similar to the Doherty amplifier 1 according to the first embodiment, the Doherty amplifier 1 in which the saturated output power of the peaking amplifier 18 is larger than the saturated output power of the carrier amplifier 17 can also prevent deterioration in efficiency when the peaking amplifier 18 outputs power lower than the saturated output power.

When the Doherty amplifier 1 is configured in such a manner that the saturated output power of the peaking amplifier 18 is larger than the saturated output power of the carrier amplifier 17, it is possible to increase an amount of backoff at which the efficiency peak point appears, as compared to the Doherty amplifier 1 according to the first embodiment.

Third Embodiment

In the third embodiment, a Doherty amplifier 1 including a first output matching circuit 51 and a second output matching circuit 52 will be described.

Figure 12:
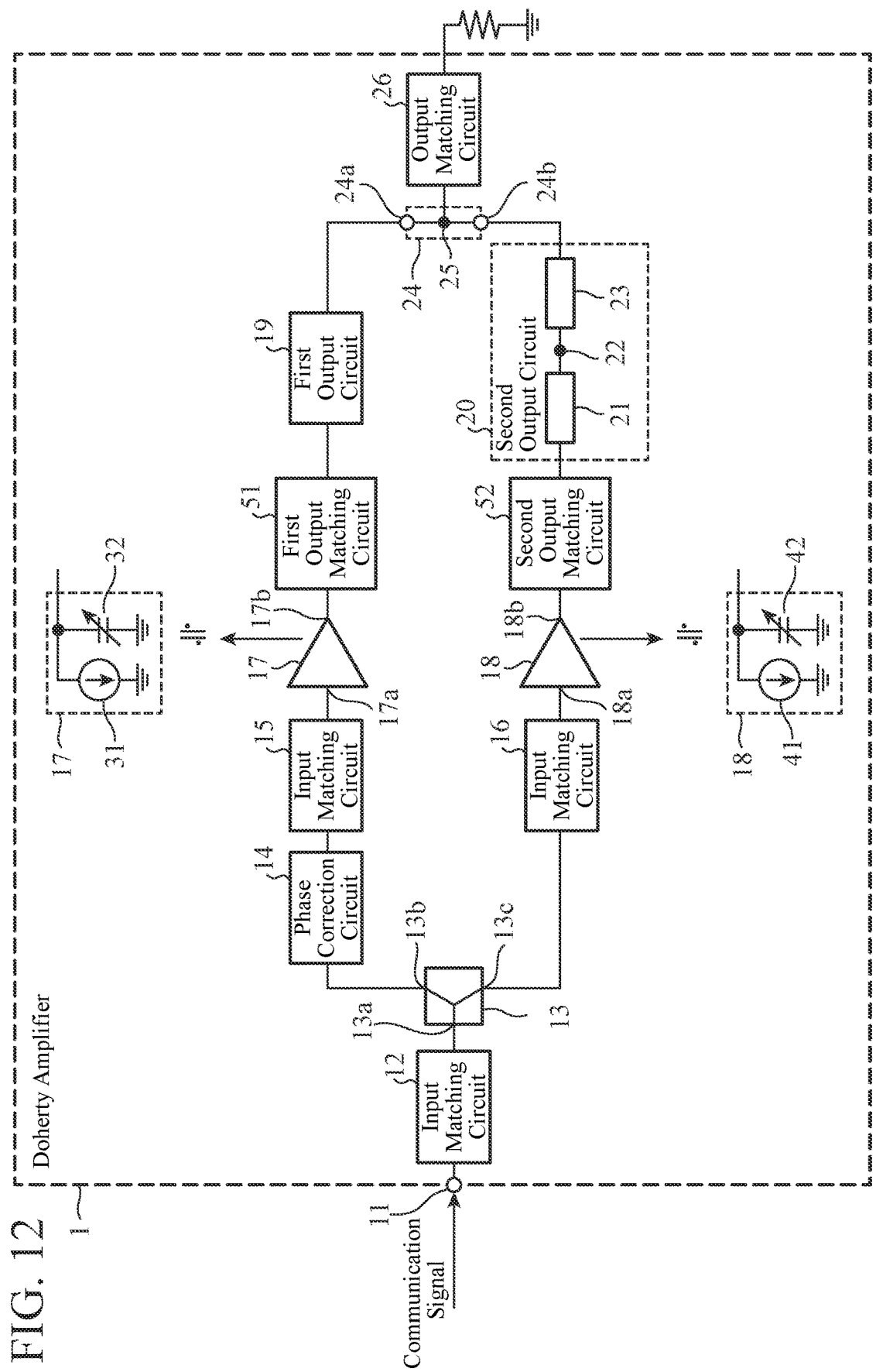
FIG. 12 is a configuration diagram illustrating a Doherty amplifier 1 according to a third embodiment.

FIG. 12 is a configuration diagram illustrating a communication device including the Doherty amplifier 1 according to the third embodiment. In FIG. 12, elements same as or corresponding to the elements in FIG. 2 are identified by the same reference numerals, and thus, the description thereof will be omitted.

The first output matching circuit 51 is implemented by, for example, a circuit using a lumped parameter element, a circuit using a distributed constant line, a circuit in which a lumped constant and a distributed constant are combined, an L-C type matching circuit, or a quarter-wave line.

One end of the first output matching circuit 51 is connected to an output terminal 17b of a carrier amplifier 17, and the other end of the first output matching circuit 51 is connected to one end of a first output circuit 19.

The first output matching circuit 51 converts the output impedance of the carrier amplifier 17 into an impedance of the first output circuit 19.

The second output matching circuit 52 is implemented by, for example, a circuit using a lumped parameter element, a circuit using a distributed constant line, a circuit in which a lumped constant and a distributed constant are combined, an L-C type matching circuit, or a quarter-wave line.

One end of the second output matching circuit 52 is connected to an output terminal 18b of a peaking amplifier 18, and the other end of the second output matching circuit 52 is connected to one end of a second output circuit 20.

The second output matching circuit 52 converts the output impedance of the peaking amplifier 18 into an impedance of the second output circuit 20.

The Doherty amplifier 1 illustrated in FIG. 12 is similar to the Doherty amplifier 1 illustrated in FIG. 2 except for being provided with the first output matching circuit 51 and the second output matching circuit 52.

Since the Doherty amplifier 1 illustrated in FIG. 12 includes the first output matching circuit 51, it is possible to prevent a first signal output from the carrier amplifier 17 from being reflected by the first output circuit 19.

Since the Doherty amplifier 1 illustrated in FIG. 12 includes the second output matching circuit 52, it is possible to prevent a second signal output from the peaking amplifier 18 from being reflected by the second output circuit 20.

Fourth Embodiment

The fourth embodiment will describe a Doherty amplifier 1 in which a band broadening circuit 60 that transforms an impedance seen by looking into a load 27 from a combining circuit 24 is inserted between the combining circuit 24 and the load 27.

Figure 13:
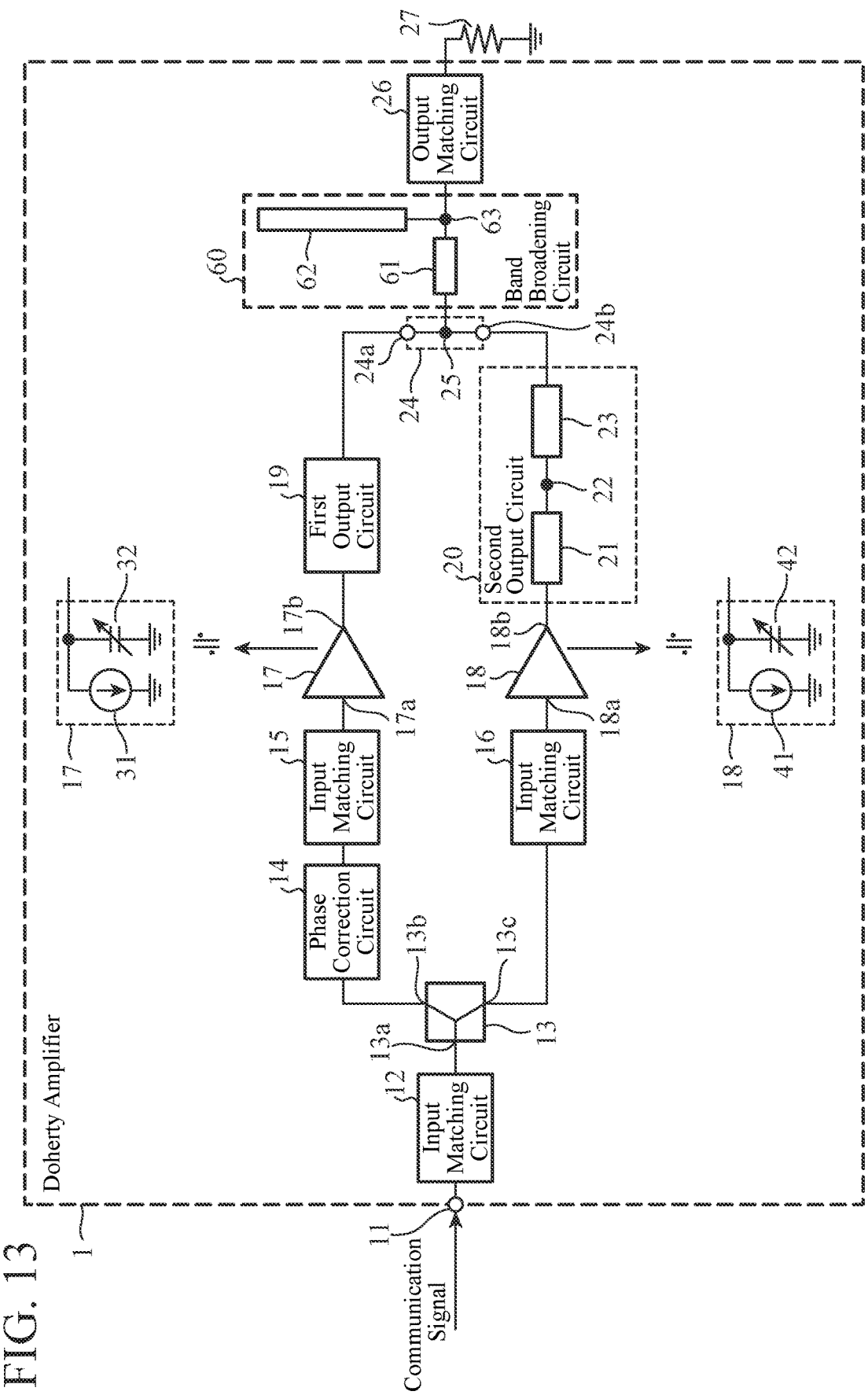
FIG. 13 is a configuration diagram illustrating a Doherty amplifier 1 according to a fourth embodiment.

FIG. 13 is a configuration diagram illustrating the Doherty amplifier 1 according to the fourth embodiment. In FIG. 13, elements same as or corresponding to the elements in FIG. 2 are identified by the same reference numerals, and thus, the description thereof will be omitted.

The band broadening circuit 60 includes a transmission line 61 and an open stub 62.

One end of the band broadening circuit 60 is connected to a combining node 25 of a combining circuit 24, and the other end of the band broadening circuit 60 is connected to one end of an output matching circuit 26.

When the frequency of a first signal amplified by a carrier amplifier 17 is shifted to a lower band side with respect to the center frequency of the frequency while the peaking amplifier 18 is stopped, the band broadening circuit 60 transforms an impedance seen by looking into the load 27 from the combining circuit 24 into an impedance in a capacitive region.

When the frequency of the first signal is shifted to a higher band side with respect to the center frequency of the frequency, the band broadening circuit 60 transforms the impedance seen by looking into the load 27 from the combining circuit 24 into an impedance in an inductive region.

The Doherty amplifier 1 illustrated in FIG. 13 is obtained by adding the band broadening circuit 60 to the Doherty amplifier 1 illustrated in FIG. 2. However, this is merely an example, and the Doherty amplifier 1 illustrated in FIG. 13 may be obtained by adding the band broadening circuit 60 to the Doherty amplifier 1 illustrated in FIG. 12.

The transmission line 61 has an electrical length $EL_3$.

One end of the transmission line 61 is connected to the combining node 25 of the combining circuit 24, and the other end of the transmission line 61 is connected to a connection node 63.

Given that the electrical length obtained by subtracting the electrical length $EL_1$ of the first output circuit 19 from the electrical length of 90 degrees is $\theta_a$, the electrical length $EL_3$ of the transmission line 61 is expressed by the following Equation (4).

$$EL_3 = \sin^{-1}[2\sin(2\theta_a)] \quad (4)$$

One end of the open stub 62 is connected to the connection node 63.

The electrical length of the open stub 62 is 180 degrees, and the characteristic impedance of the open stub 62 is half the optimum load impedance Ropt when the output power of the carrier amplifier 17 reaches the saturated output power.

The connection node 63 is connected with the other end of the transmission line 61, one end of the open stub 62, and one end of the output matching circuit 26.

Next, the operation of the Doherty amplifier 1 illustrated in FIG. 13 will be described. It is to be noted that, since the Doherty amplifier 1 illustrated in FIG. 13 is similar to the Doherty amplifier 1 illustrated in FIG. 2 except for the band broadening circuit 60, the operation of the band broadening circuit 60 will be mainly described below.

When the frequency of the first signal output from the divider 13 is not shifted from the center frequency while the peaking amplifier 18 is stopped, the band broadening circuit 60 does not transform the impedance seen by looking into the load 27 from the combining circuit 24.

When the frequency of the first signal is shifted to a lower band side with respect to the center frequency, the band broadening circuit 60 transforms the impedance seen by looking into the load 27 from the combining circuit 24 into an impedance in a capacitive region.

When the frequency of the first signal is shifted to a higher band side with respect to the center frequency, the band broadening circuit 60 transforms the impedance seen by looking into the load 27 from the combining circuit 24 into an impedance in an inductive region.

The impedance transformation by the band broadening circuit 60 will be specifically described below.

Figure 14:
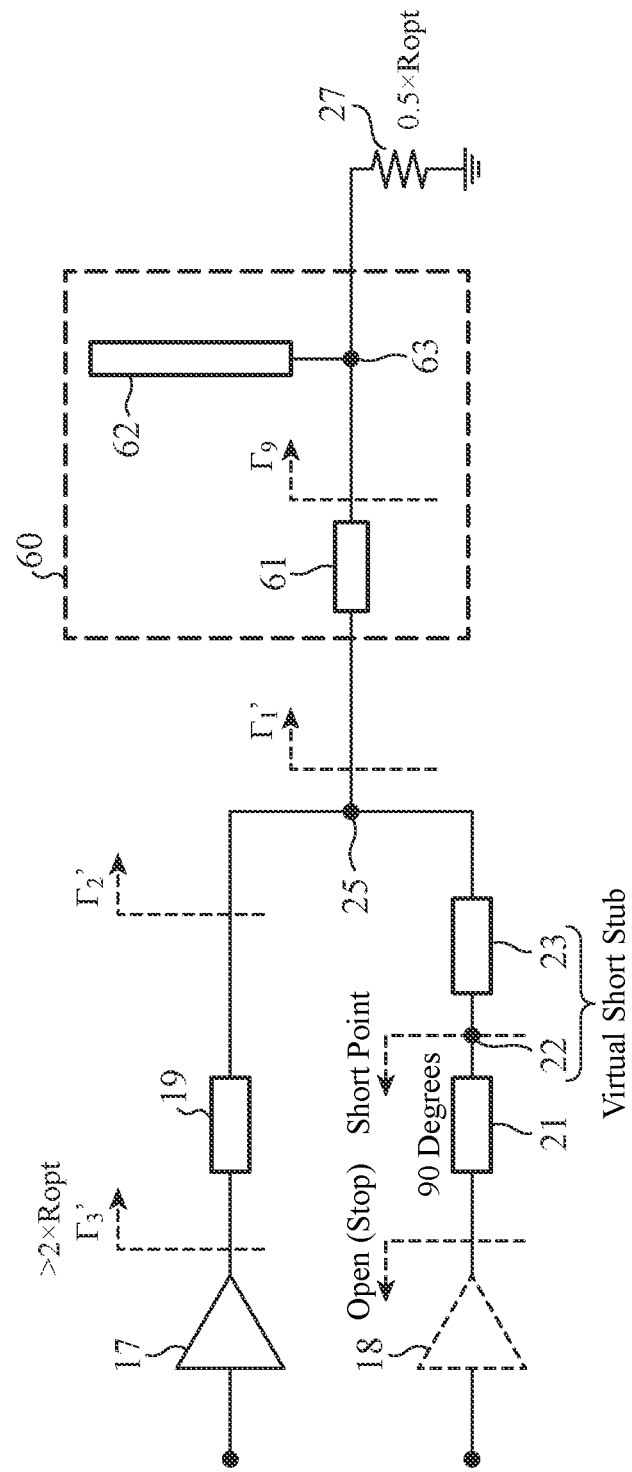
FIG. 14 is an explanatory diagram illustrating an operation of the Doherty amplifier 1 during backoff.

FIG. 14 is an explanatory diagram illustrating an operation of the Doherty amplifier 1 during backoff. In FIG. 14, the output matching circuit 26 is not illustrated.

Figure 15:
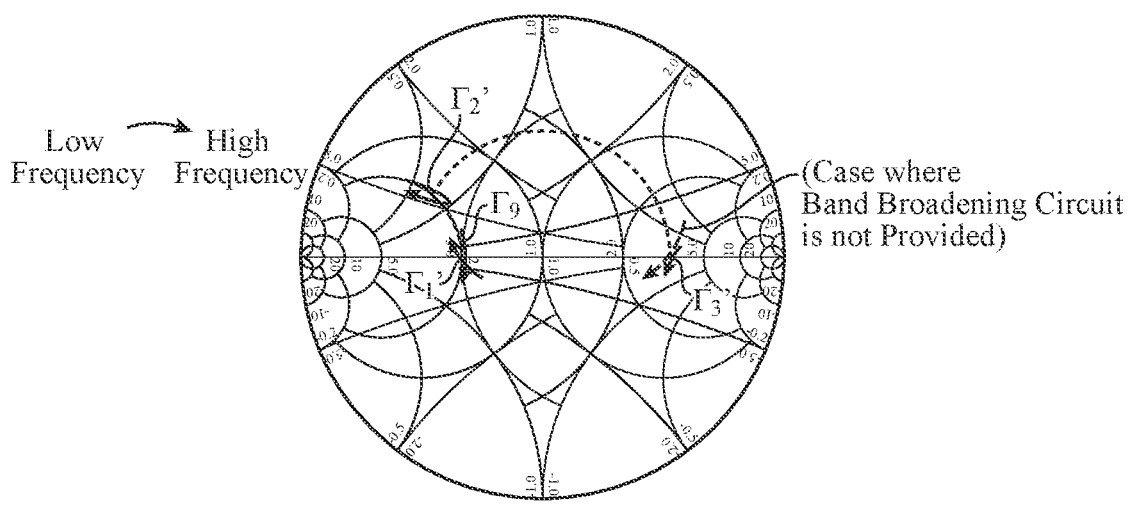
FIG. 15 is an explanatory diagram illustrating load transformation in the operation of the Doherty amplifier 1 during backoff.

FIG. 15 is an explanatory diagram illustrating load transformation in the operation of the Doherty amplifier 1 during backoff.

During backoff, the peaking amplifier 18 stops, and thus, the output impedance of the peaking amplifier 18 is in an open state as illustrated in FIG. 14.

The output impedance of the peaking amplifier 18 is transformed by the transmission line 21 having an electrical length of 90 degrees, and a short point is formed at the connection node 22.

Since the short point is formed at the connection node 22, the transmission line 23 functions as a virtual short stub when the peaking amplifier 18 is seen from the combining node 25.

Since the transmission line 23 functions as a virtual short stub, the output load 0.5×Ropt, which is the impedance $\Gamma_1'$ seen by looking into the load 27 from the combining node 25, is transformed into an impedance $\Gamma_2'$ as illustrated in FIG. 15.

The impedance $\Gamma_2'$ is transformed into an impedance $\Gamma_3'$ on the real axis by the first output circuit 19 as illustrated in FIG. 15.

The impedance $\Gamma_3'$ is the output load impedance of the carrier amplifier 17, and is larger than the impedance 2×Ropt of a typical Doherty amplifier when the amount of backoff is 6 dB.

Therefore, the amount of backoff of the Doherty amplifier 1 illustrated in FIG. 13 can be made larger than the amount of backoff of a typical Doherty amplifier.

In the Doherty amplifier 1 illustrated in FIG. 13, one end of the open stub 62 is connected to the connection node 63. Therefore, the impedance $\Gamma_9$ seen by looking into the load 27 from the other end of the transmission line 61 is an impedance in an inductive region as illustrated in FIG. 15 if the frequency of the first signal is shifted to the lower band side with respect to the center frequency.

The impedance $\Gamma_9$ seen by looking into the load 27 from the other end of the transmission line 61 is an impedance in a capacitive region as illustrated in FIG. 15 when the frequency of the first signal is shifted to the higher band side with respect to the center frequency.

The impedance $\Gamma_9$ is transformed into the impedance $\Gamma_1'$ by the transmission line 61 by being rotated clockwise on the Smith chart illustrated in FIG. 15.

At this time, if the frequency of the first signal is shifted to the lower band side with respect to the center frequency, the impedance $\Gamma_9$ is transformed into the impedance $\Gamma_1'$ in the capacitive region. If the frequency of the first signal is shifted to the higher band side with respect to the center frequency, the impedance $\Gamma_9$ is transformed into the impedance $\Gamma_1'$ in the inductive region.

The impedance $\Gamma_1'$ is transformed into the impedance $\Gamma_2'$ in the inductive region as illustrated in FIG. 15 by the transmission line 23 functioning as a virtual short stub.

Even when the frequency of the first signal changes from a frequency on the lower band side with respect to the center frequency to a frequency on the higher band side with respect to the center frequency, the impedance $\Gamma_2'$ only rotates clockwise as illustrated in FIG. 15.

As illustrated in FIG. 15, the impedance $\Gamma_2'$ is transformed into an impedance $\Gamma_3'$ by the first output circuit 19. In a case where the frequency of the first signal is shifted from the center frequency when the band broadening circuit 60 is not connected to the output side of the combining circuit 24, the impedance $\Gamma_3'$ may deviate greatly from the real axis as illustrated in FIG. 15.

In the Doherty amplifier 1 illustrated in FIG. 13, the band broadening circuit 60 is connected to the output side of the combining circuit 24. Therefore, even if the frequency of the first signal is shifted from the center frequency, the impedance $\Gamma_3'$ is transformed substantially on the real axis as illustrated in FIG. 15.

In the above fourth embodiment, when the frequency of the first signal is shifted to the lower band side with respect to the center frequency while the peaking amplifier 18 is stopped, the band broadening circuit 60 transforms the impedance seen by looking into the load 27 from the combining circuit 24 into an impedance in a capacitive region. When the frequency of the first signal is shifted to the higher band side with respect to the center frequency, the band broadening circuit 60 transforms the impedance seen by looking into the load 27 from the combining circuit 24 into an impedance in an inductive region. The Doherty amplifier 1 is configured as described above. Therefore, similar to the Doherty amplifier 1 illustrated in FIG. 2, the Doherty amplifier 1 can prevent deterioration in efficiency when the peaking amplifier 18 outputs power lower than the saturated output power. In addition, even if the frequency of the first signal is shifted from the center frequency, it is possible to prevent deterioration in efficiency when the peaking amplifier 18 is stopped.

Fifth Embodiment

In a fifth embodiment, a Doherty amplifier 1 including a first transmission line 71 and a second transmission line 72 will be described.

Figure 16:
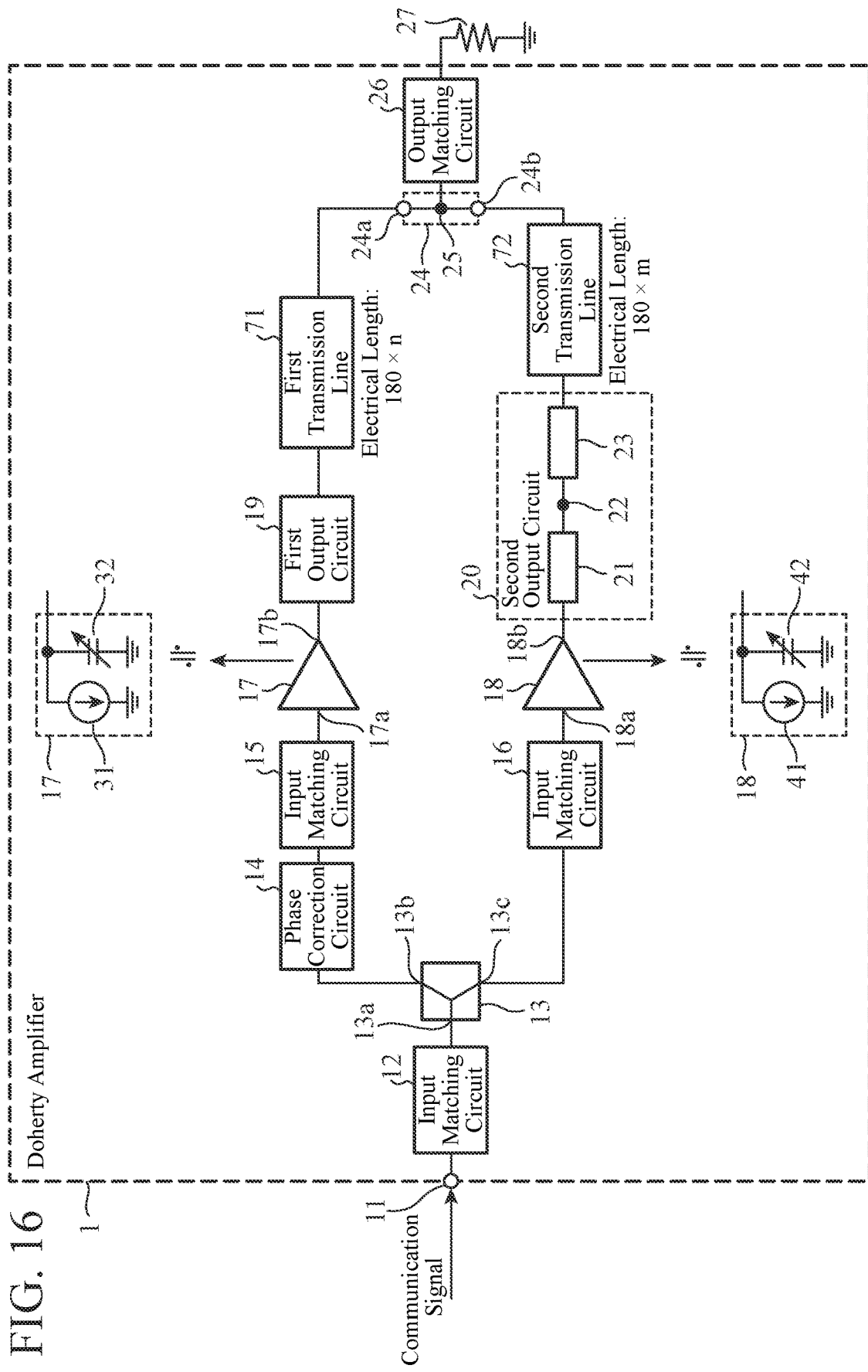
FIG. 16 is a configuration diagram illustrating a Doherty amplifier 1 according to a fifth embodiment.

FIG. 16 is a configuration diagram illustrating the Doherty amplifier 1 according to the fifth embodiment. In FIG. 16, elements same as or corresponding to the elements in FIGS. 2, 12 and 13 are identified by the same reference numerals, and thus, the description thereof will be omitted.

The first transmission line 71 has an electrical length n (n is a positive or negative integer) times 180 degrees.

One end of the first transmission line 71 is connected to the other end of a first output circuit 19, and the other end of the first transmission line 71 is connected to an input terminal 24a of a combining circuit 24.

The second transmission line 72 has an electrical length m (m is a positive or negative integer) times 180 degrees.

One end of the second transmission line 72 is connected to the other end of a second output circuit 20, and the other end of the second transmission line 72 is connected to the input terminal 24b of the combining circuit 24.

The Doherty amplifier 1 illustrated in FIG. 16 is obtained by applying the first transmission line 71 and the second transmission line 72 to the Doherty amplifier 1 illustrated in FIG. 2. However, this is merely an example, and the Doherty amplifier 1 illustrated in FIG. 16 may be obtained by applying the first transmission line 71 and the second transmission line 72 to the Doherty amplifier 1 illustrated in FIG. 12 or 13.

The Doherty amplifier 1 illustrated in FIG. 16 is similar to the Doherty amplifier 1 illustrated in FIG. 2 except for being provided with the first transmission line 71 and the second transmission line 72.

Even if the Doherty amplifier 1 illustrated in FIG. 16 includes the first transmission line 71 and the second transmission line 72, it is possible to prevent deterioration in efficiency when the peaking amplifier 18 outputs power lower than saturated output power as in the Doherty amplifier 1 illustrated in FIG. 2.

The Doherty amplifier 1 illustrated in FIG. 16 includes the first transmission line 71 and the second transmission line 72, and each of the first transmission line 71 and the second transmission line 72 can be routed depending on, for example, the size of a substrate on which the Doherty amplifier 1 illustrated in FIG. 16 is mounted.

Sixth Embodiment

In the sixth embodiment, a Doherty amplifier 1 including a first input signal source 81 and a second input signal source 82 will be described.

Figure 17:
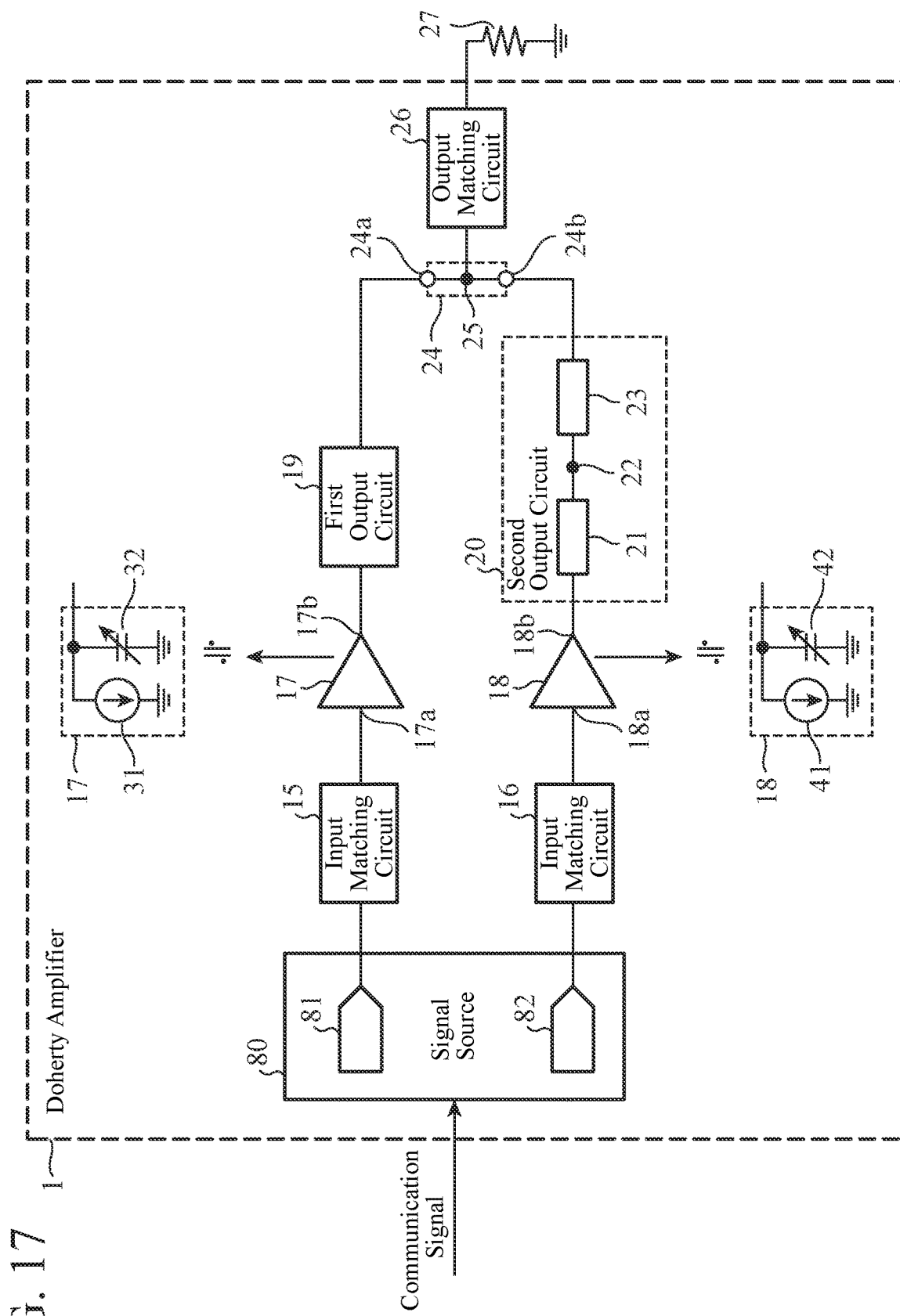
FIG. 17 is a configuration diagram illustrating a Doherty amplifier 1 according to a sixth embodiment.

FIG. 17 is a configuration diagram illustrating the Doherty amplifier 1 according to the sixth embodiment. In FIG. 17, elements same as or corresponding to the elements in FIGS. 2, 12, 13, and 16 are identified by the same reference numerals, and thus, the description thereof will be omitted.

A signal source 80 includes the first input signal source 81 and the second input signal source 82.

The signal source 80 divides a communication signal input to the signal source 80 into two signals.

The signal source 80 outputs one of the two signals to the first input signal source 81 and outputs the other signal to the second input signal source 82.

The first input signal source 81 is implemented by, for example, a quadrature modulator, a digital analog convertor (DAC), and a direct digital synthesizer (DDS).

The first input signal source 81 outputs the first signal to the input terminal 17a of the carrier amplifier 17 via the input matching circuit 15. The first signal includes information same as information included in one of the signals.

The second input signal source 82 is implemented by, for example, a quadrature modulator, a DAC, and a DDS.

The second input signal source 82 outputs a second signal to the input terminal 18a of the peaking amplifier 18 via the input matching circuit 16. The second signal includes information same as information included in the other signal.

The Doherty amplifier 1 illustrated in FIG. 17 is obtained by adding the signal source 80 to the Doherty amplifier 1 illustrated in FIG. 2. However, this is merely an example, and the Doherty amplifier 1 illustrated in FIG. 17 may be obtained by adding the signal source 80 to the Doherty amplifier 1 illustrated in FIG. 12, 13, or 16.

In the Doherty amplifier 1 illustrated in FIG. 17, a bias voltage substantially the same as a threshold voltage is applied to the input terminal 17a of the carrier amplifier 17. The carrier amplifier 17 performs a signal amplification operation when the voltage of the input terminal 17a is larger than the threshold voltage, and does not perform the signal amplification operation when the voltage of the input terminal 17a is equal to or lower than the threshold voltage.

Therefore, it is possible to switch the operation of the carrier amplifier 17 depending on whether or not the first signal is input to the input terminal 17a of the carrier amplifier 17.

A bias voltage substantially the same as the threshold voltage is applied to the input terminal 18a of the peaking amplifier 18. The peaking amplifier 18 performs a signal amplification operation when the voltage of the input terminal 18a is larger than the threshold voltage, and does not perform the signal amplification operation when the voltage of the input terminal 18a is equal to or lower than the threshold voltage.

Therefore, it is possible to switch the operation of the peaking amplifier 18 depending on whether or not the second signal is input to the input terminal 18a of the peaking amplifier 18.

Next, the operation of the Doherty amplifier 1 illustrated in FIG. 17 will be described.

The signal source 80 divides the communication signal input to the signal source 80 into two signals.

The signal source 80 outputs one of the two signals to the first input signal source 81 and outputs the other signal to the second input signal source 82.

When receiving one of the two signals, the first input signal source 81 outputs a first signal to the input terminal 17a of the carrier amplifier 17 via the input matching circuit 15.

The carrier amplifier 17 amplifies the first signal and outputs the amplified first signal to the first output circuit 19.

When receiving the other signal, the second input signal source 82 outputs a second signal to the input terminal 18a of the peaking amplifier 18 via the input matching circuit 16.

However, during backoff, the second input signal source 82 does not output the second signal to the input terminal 18a of the peaking amplifier 18 via the input matching circuit 16. If the second signal is not output from the second input signal source 82, the peaking amplifier 18 does not perform the signal amplification operation.

When the Doherty amplifier 1 outputs power larger than that during backoff, the second input signal source 82 outputs the second signal to the input terminal 18a of the peaking amplifier 18 via the input matching circuit 16.

The peaking amplifier 18 amplifies the second signal and outputs the amplified second signal to the second output circuit 20.

Similar to the Doherty amplifier 1 illustrated in FIG. 2, the Doherty amplifier 1 including the first input signal source 81 and the second input signal source 82 can also prevent deterioration in efficiency when the peaking amplifier 18 outputs power lower than saturated output power.

With the first input signal source 81 and the second input signal source 82, the Doherty amplifier 1 illustrated in FIG. 17 can increase the efficiency more than the Doherty amplifier 1 illustrated in FIG. 2 by controlling the signal amplification operation of the peaking amplifier 18.

It is to be noted that two or more of the above embodiments can be freely combined, or any component in the embodiments can be modified or omitted, within the scope of the present invention.

INDUSTRIAL APPLICABILITY

The present invention is suitable for a Doherty amplifier and a communication device.

REFERENCE SIGNS LIST

1: Doherty amplifier, 11: input terminal, 12: input matching circuit, 13: divider, 13a: input terminal, 13b: output terminal. 13c: output terminal, 14: phase correction circuit. 15: input matching circuit, 16: input matching circuit, 17: carrier amplifier. 17a: input terminal, 17b: output terminal, 18: peaking amplifier. 18a: input terminal, 18b: output terminal, 19: first output circuit, 20: second output circuit, 21: transmission line, 22: connection node. 23: transmission line. 24: combining circuit, 24a. 24b: input terminal. 25: combining node. 26: output matching circuit, 27: load, 31: current source. 32: capacitor, 41: current source, 42, 43, 44: capacitor, 51: first output matching circuit, 52: second output matching circuit, 60: band broadening circuit, 61: transmission line, 62: open stub, 63: connection node, 71: first transmission line. 72: second transmission line, 80: signal source, 81: first input signal source, 82: second input signal source

The invention claimed is:

1. A Doherty amplifier comprising:
a carrier amplifier for amplifying a first signal and outputting the amplified first signal;
a peaking amplifier for amplifying a second signal and outputting the amplified second signal, the peaking amplifier having a non-linear output capacitance;
a first output circuit for transmitting the first signal output from the carrier amplifier;
a second output circuit for functioning as a virtual short stub when the peaking amplifier does not perform an amplification operation, and transmitting the second signal output from the peaking amplifier; and
a combining circuit for combining the first signal transmitted by the first output circuit and the second signal transmitted by the second output circuit and outputting a combined signal of the first signal and the second signal,
wherein, when the peaking amplifier performs the amplification operation, the second output circuit transforms an impedance seen by looking into the combining circuit from the peaking amplifier into an impedance in an inductive region, and
wherein the peaking amplifier reduces an inductive component of the impedance seen by looking into the combining circuit from the peaking amplifier by the non-linear output capacitance of the peaking amplifier.

2. The Doherty amplifier according to claim 1, wherein the first output circuit has an electrical length of less than 90 degrees that compensates for reactance of the second output circuit as seen from an output side of the carrier amplifier when the peaking amplifier does not perform the amplification operation.

3. The Doherty amplifier according to claim 1, further comprising:
a first output matching circuit for converting an output impedance of the carrier amplifier into an impedance of the first output circuit; and
a second output matching circuit for converting an output impedance of the peaking amplifier into an impedance of the second output circuit.

4. A communication device comprising the Doherty amplifier according to claim 1 as an amplifier that amplifies each of the first signal and the second signal, the first and second signals corresponding to signals obtained by dividing a communication signal.

5. A Doherty amplifier comprising:
a carrier amplifier for amplifying a first signal and outputting the amplified first signal;
a peaking amplifier for amplifying a second signal and outputting the amplified second signal, the peaking amplifier having a non-linear output capacitance;
a first output circuit for transmitting the first signal output from the carrier amplifier;
a second output circuit for functioning as a virtual short stub when the peaking amplifier does not perform an amplification operation, and transmitting the second signal output from the peaking amplifier; and
a combining circuit for combining the first signal transmitted by the first output circuit and the second signal transmitted by the second output circuit and outputting a combined signal of the first signal and the second signal,
wherein, when the peaking amplifier performs the amplification operation, the second output circuit transforms an impedance seen by looking into the combining circuit from the peaking amplifier into an impedance in an inductive region, and
wherein the second output circuit has an electrical length larger than 90 degrees and smaller than 180 degrees.

6. A Doherty amplifier comprising:
a carrier amplifier for amplifying a first signal and outputting the amplified first signal;
a peaking amplifier for amplifying a second signal and outputting the amplified second signal, the peaking amplifier having a non-linear output capacitance;

a first output circuit for transmitting the first signal output from the carrier amplifier;

a second output circuit for functioning as a virtual short stub when the peaking amplifier does not perform an amplification operation, and transmitting the second signal output from the peaking amplifier; and a combining circuit for combining the first signal transmitted by the first output circuit and the second signal transmitted by the second output circuit and outputting a combined signal of the first signal and the second signal, wherein, when the peaking amplifier performs the amplification operation, the second output circuit transforms an impedance seen by looking into the combining circuit from the peaking amplifier into an impedance in an inductive region, and wherein the second output circuit has an electrical length larger than-90 degrees and smaller than 0 degrees in a left-handed coordinate system.

* * * * *